(12) United States Patent
Carissimi et al.

(10) Patent No.: US 9,349,490 B2
(45) Date of Patent: May 24, 2016

(54) ERROR CORRECTION IN DIFFERENTIAL MEMORY DEVICES WITH READING IN SINGLE-ENDED MODE IN ADDITION TO READING IN DIFFERENTIAL MODE

(71) Applicant: STMICROELECTRONICS S.r.l., Agrate Brianza (IT)

(72) Inventors: Marcella Carissimi, Treviolo (IT); Marco Pasotti, Travaco' Siccomario (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 3 days.

(21) Appl. No.: 14/597,824

(22) Filed: Jan. 15, 2015

(65) Prior Publication Data
US 2015/0212880 A1 Jul. 30, 2015

(30) Foreign Application Priority Data

Jan. 24, 2014 (IT) .............................. MI2014A0099

(51) Int. Cl.

| | |
|---|---|
| G11C 29/00 | (2006.01) |
| G11C 29/52 | (2006.01) |
| G11C 7/18 | (2006.01) |
| G11C 11/56 | (2006.01) |
| G11C 16/04 | (2006.01) |
| G11C 16/26 | (2006.01) |
| G11C 16/28 | (2006.01) |
| G06F 11/10 | (2006.01) |

(52) U.S. Cl.
CPC ............ *G11C 29/52* (2013.01); *G06F 11/1048* (2013.01); *G11C 7/18* (2013.01); *G11C 11/5642* (2013.01); *G11C 16/0441* (2013.01); *G11C 16/26* (2013.01); *G11C 16/28* (2013.01); *G11C 2211/4013* (2013.01)

(58) Field of Classification Search
CPC ...... G11C 29/52; G11C 7/18; G11C 11/5642; G11C 16/0441; G11C 16/26; G11C 16/28; G11C 2211/4013
See application file for complete search history.

(56) References Cited

U.S. PATENT DOCUMENTS

| | | | |
|---|---|---|---|
| 2007/0058414 A1 | 3/2007 | Hoya | |
| 2007/0091677 A1 | 4/2007 | Lasser | |
| 2008/0320366 A1 | 12/2008 | Lin | |
| 2009/0240872 A1 | 9/2009 | Perlmutter | |
| 2009/0244997 A1* | 10/2009 | Searles ................ | G11C 7/1051 365/194 |
| 2011/0085378 A1 | 4/2011 | Ho | |
| 2012/0268994 A1 | 10/2012 | Nagashima | |

FOREIGN PATENT DOCUMENTS

EP 0442301 A2 8/1991

* cited by examiner

*Primary Examiner* — Sam Rizk
(74) *Attorney, Agent, or Firm* — Allen, Dyer, Doppelt, Milbrath & Gilchrist, P.A.

(57) ABSTRACT

A differential memory device includes of memory locations having a direct memory cell and a complementary memory cell. A corresponding method includes receiving a request of reading a selected data word associated with a selected code word, reading a differential code word representing a differential version of the selected code word, verifying the differential code word according to an error correction code, setting the selected data word according to the differential code word in response to a positive verification. The method further includes reading at least one single-ended code word representing a single-ended version of the selected code word, verifying the single-ended code word according to the error correction code, and setting the selected data word according to the single-ended code word in response to a negative verification of the differential code word and to a positive verification of the single-ended code word.

15 Claims, 7 Drawing Sheets

ERROR CORRECTION IN DIFFERENTIAL MEMORY DEVICES WITH READING IN SINGLE-ENDED MODE IN ADDITION TO READING IN DIFFERENTIAL MODE

FIELD

The present disclosure relates to the field of memory devices. More specifically, this disclosure relates to the reading of differential memory devices.

BACKGROUND

Memory devices are used to store information in a number of applications for this purpose, each memory device comprises a plurality of memory cells, each one for storing one or more logic values (such as one bit). For example, non-volatile memory devices are used to store information that has to be retained even when the memory devices are not powered. Generally, each memory cell is based on a floating gate MOS transistor, which has a threshold voltage that may be set (according to an electric charge in its floating gate) to different levels representing corresponding logic values. Particularly, in Few Time Programmable, or FTP (non-volatile) memory devices (also known as Multiple Time Programmable, or MTP, or Cost-effective memory devices) the memory cells are manufactured without a dedicated oxide layer for their floating gates (so as to allow the use of standard CMOS production processes at relatively low cost); this makes the FTP memory devices very attractive for use as embedded memories of small capacity (such as up to some Kbytes) in CMOS devices (for example, for storing corresponding booting information).

The memory devices may be subject to faults during a reading of their memory cells, which faults may cause corresponding errors in the logic values that are read. For example, in the FTP memory devices the faults may be due to a relatively poor quality of the oxide layer of the floating gates of the memory cells; in any case, a fault rate of the FTP memory devices significantly increases with their aging (because of retention phenomena of electric change in the floating gates of its memory cells).

Several techniques are known in the art for improving a reliability of the memory devices. Particularly, the memory devices may have different architectures. For example, in a single-ended architecture each memory cell storing one bit is read by comparing its state with a corresponding reference. On the other hand, in a differential architecture the memory cells are organized in pairs. Each pair of memory cells (referred to as direct memory cell and complementary memory cell) defines a memory location for one bit (represented by the actual bit stored in the direct memory cell and its complement stored in the complementary memory cell), which memory location is read by comparing the states of its memory cells between them. The differential architecture increases the reliability of the memory devices, since it substantially doubles a reading margin of its memory cells (at the cost of a reduced capacity thereof).

In addition, Error Correction Codes, or ECC, may be used. In this case, (redundancy) control information is added to the (actual) payload information of interest; for example, one or more control bits (also called check bits) of the control information are added to each data word (formed by one or more bits of the payload information), thereby creating a code word that is stored in the memory device. The control information is used for detecting and correcting (if possible) some errors in the reading of the memory cells, so as to tolerate the corresponding faults without impairing operation of the memory devices. The capability of correcting the errors or of simply detecting the errors (but without correcting them) depends on the amount of control information that is added to the payload information; for example, code words each one composed by a data word of 32 bits plus 7 control bits allow correcting 1 error, whereas code words each one composed by a data word of 64 bits plus 21 control bits allow correcting 3 errors.

However, an increase of the amount of control information (to increase the error correction and detection capability) accordingly reduces the capacity of the memory device. Moreover, the complexity of a circuitry used to implement the above-mentioned ECC functionality increases with the amount of the control information. This complexity of the ECC circuitry involves a waste of area of the memory devices (with a further reduction of their capacity). In addition, this complexity of the ECC circuitry increases an access time of the memory devices (thereby slowing down their entire operation) and a power consumption thereof.

SUMMARY OF THE INVENTION

A simplified summary of the present disclosure is herein presented to provide a basic understanding thereof; however, a purpose of this summary is to introduce some concepts of the disclosure in a simplified form as a prelude to its following more detailed description, and it is not to be interpreted as an identification of its key elements nor as a delineation of its scope.

In general terms, the present disclosure is based on adding one or more readings in single-ended mode to a reading in differential mode. Particularly, an aspect provides a method for reading a differential memory device, wherein a selected data word to be read (associated with a selected code word stored with an error correction code) is set according at least one single-ended code word (representing a single-ended version of the selected code word) in response to a negative verification of a differential code word (representing a differential version of the selected code word).

A further aspect provides a software program for implementing the method (and a corresponding software program product).

A further aspect provides a corresponding differential memory device.

A further aspect provides a system comprising one or more of these differential memory devices.

BRIEF DESCRIPTION OF THE DRAWINGS

The approach of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). Particularly.

DETAILED DESCRIPTION

Figure 1:
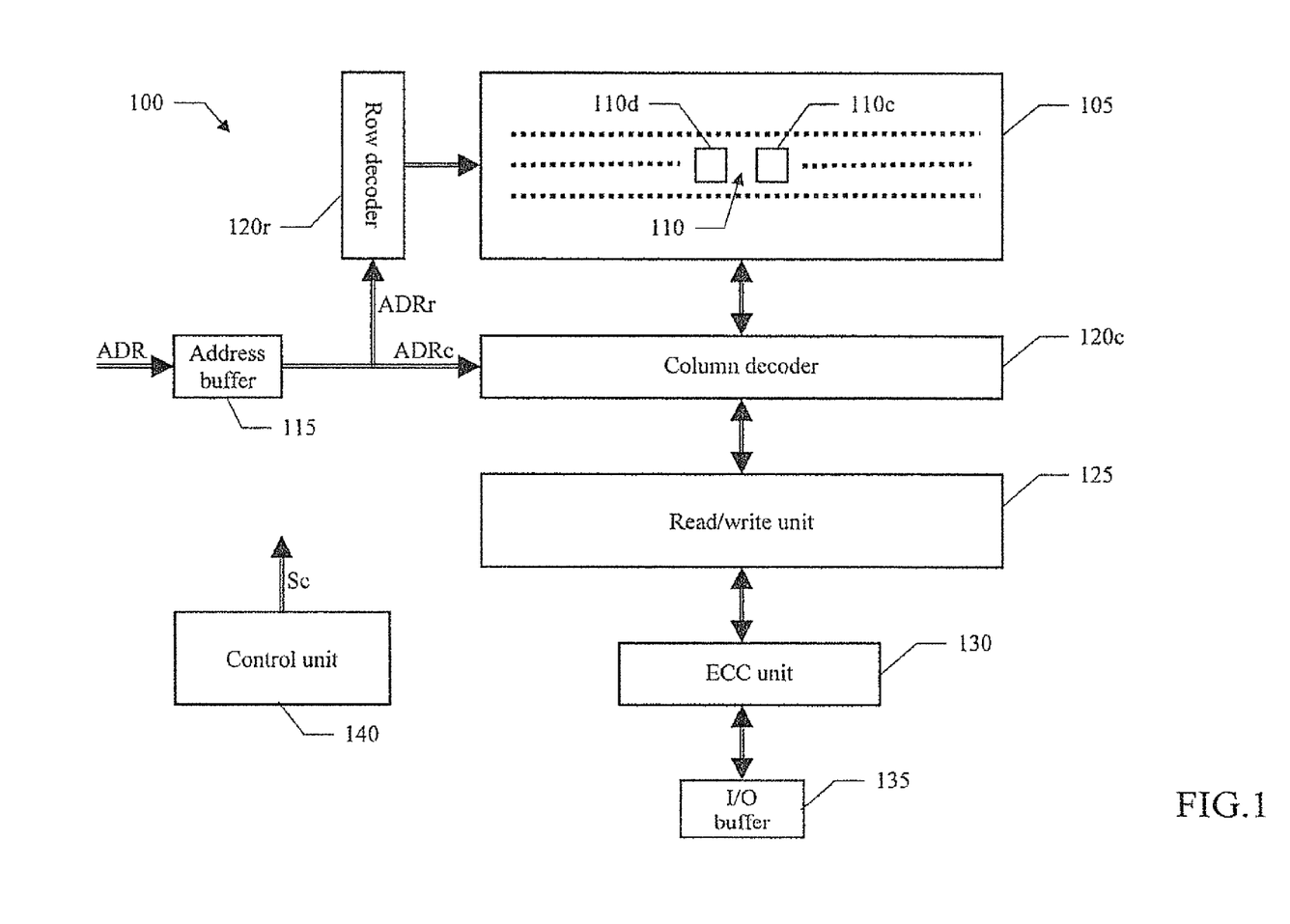
FIG. 1 is a schematic diagram showing a memory device wherein the approach according to an embodiment of the present disclosure may be applied.

With reference in particular to FIG. 1, a schematic block diagram is shown of a memory device 100 wherein the approach according to an embodiment of the present disclosure may be applied; particularly, the memory device 100 is a non-volatile memory device of the FTP type (for example, embedded in a system, not shown in the figure).

The memory device 100 includes a memory matrix 105, which is formed by a plurality of memory cells (only two shown in the figure, denoted with the references 110d and 110c) organized in rows and columns (for example, 128-512 rows and 512-1024 columns). Each memory cell 110d, 110c is based on a floating gate MOS transistor with a single poly-silicon layer, which transistor has a threshold voltage depending on the electric charge in its floating gate. The different levels of the threshold voltage represent corresponding values (0 or 1) of one bit; typically, the memory cell 110d, 110c is programmed (value 0) when its transistor has a high threshold voltage, whereas the memory cell 110 is erased (value 1) when its transistor has a low threshold voltage. The memory cells 110c, 110d are organized in pairs, each one formed by a direct memory cell 110d and a complementary memory cell 110c that define a memory location 110 for storing one bit. In detail, the bit is represented by the actual value of the bit stored in the direct memory cell 110d and by its complement value stored in the complementary memory cell 110c (with the memory location 110 that is not-written when both its direct memory cell 110d and complementary memory cell 110c store the same value).

Physically, each memory cell 110d, 110c may be programmed individually by biasing it so as to inject electric charge into the floating gate of its transistor; conversely, the memory device 100 is erased at the level of sectors (for example, each one consisting of a row of the memory matrix 105) by biasing its memory cells 110d, 110c so as to remove electric charge from the floating gates of their transistors. Moreover, each memory location 110 may be read individually in a differential mode. For this purpose, a direct current provided by its direct memory cell 110d and a complementary current provided by its complementary memory cell 110c (when suitably biased) are compared between them.

However, the memory device 100 typically processes (i.e., reads and writes) multiple bits simultaneously at the level of words. Particularly, the memory device 100 implements an ECC. For this purpose, the memory device 100 provides a memory space of data words storing payload information actually of interest. However, redundant control information is added to the payload information of each data word so as to obtain a corresponding code word, which is stored in a corresponding page of memory locations 110. For example, the ECC implements a Hamming code with code words each one composed by a data word of 32 bits plus 7 control bits (for a total of 39 bits), which provides a Single Error Correction and Double Error Detection (SER-DED) capability since it allows correcting any single error (relating to one bit) and detecting any double error (relating to two bits) in the code word.

An address buffer 115 receives an address ADR of a selected data word (whose code word is to be read from or written into a corresponding selected page), or of a selected sector to be erased. The address buffer 115 extracts a row address ADRr and a column address ADRc from the address ADR. The row address ADRr is provided to a row decoder 120r that selects the row of the selected page or sector in the memory matrix 105; the column address ADRc is supplied to a column decoder 120c, which selects, within each packet of columns associated with a corresponding i-th position within all the pages, the column of the selected page.

A read/write unit 125 comprises all the components (for example, a power management unit with charge pumps, sense amplifiers, pulse generators, and the like) that are used for writing (i.e., erasing and programming) and reading the memory matrix 105. For this purpose, the read/write unit 125 is coupled with the column decoder 120c and with an ECC unit 130, which in turn is coupled with an input/output (I/O) buffer 135. The input/output buffer 135 receives a data word to be written into a selected page and passes it to the ECC unit 130, which converts the data word into the corresponding code word and passes it to the read/write unit 125 that programs the memory cells 110d, 110c of the selected page (initially being all erased) when necessary; conversely, the read/write unit 125 reads a code word from a selected page and passes it to the ECC unit 130, which generates the corresponding data word from the code word (by correcting it when necessary and possible) and passes it to the input/output buffer 135.

A control unit 140 (for example, implemented by a state machine) controls operation of the whole memory device 100 (via corresponding control signals, denoted as a whole with the reference Sc).

Figure 2:
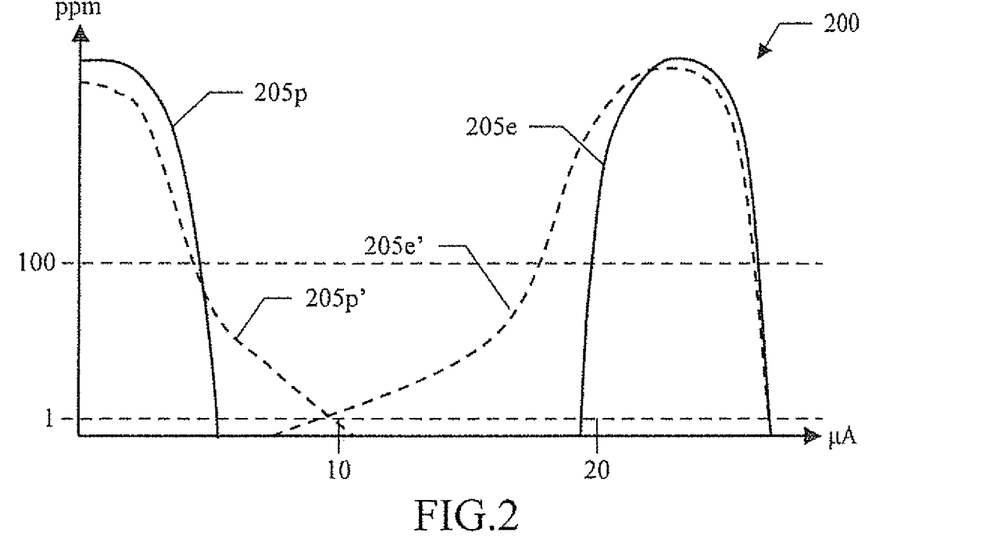
FIG. 2 is an illustrative representation of exemplary statistical distributions of the memory cells of the memory device of FIG. 1.

With reference now to FIG. 2, an illustrative representation is shown of exemplary statistical distributions of the memory cells of this memory device. For this purpose, a diagram 200 plots the number of memory cells on the ordinate axis (as parts-per-million, or ppm, i.e., $10^{-6}$, in a logarithmic scale) against their direct/complementary currents (in µA), generically denoted as reading currents, on the abscissa axis; particularly, a probability curve 205e (in solid line) represents the probability distribution of the reading currents of the memory cells that are erased, and a probability curve 205p (in solid line) represents the probability distribution of the reading currents of the memory cells that are programmed. The erased memory cells have higher reading currents (since their lower threshold voltages make them more conductive), whereas the programmed memory cells have lower reading currents (since their higher threshold voltages make them less conductive). In each memory location, therefore, when the direct current is higher than the complementary current, the value 1 is read since the direct memory location is erased (value 1) and the complementary memory cell is programmed (value 0); conversely, when the direct current is lower than the complementary current, the value 0 is read since the direct memory location is programmed (value 0) and the complementary memory cell is erased (value 1).

Ideally, the probability curve 205e and the probability curve 205p are clearly separated (for example, by 10-15 µA). However, in practice the threshold voltages of the memory cells may be subject to a drift (especially with their aging); particularly, the threshold voltages of the erased memory cells may increase (because of phenomena of retention of the electric charge that remains trapped in their floating gates after repeated programming cycles) thereby reducing the reading currents, and the threshold voltages of the programmed memory cells may reduce (because of phenomena of leakage of the electric charge that is lost from their floating gates over time) thereby increasing the reading currents. As a result, the corresponding (actual) probability distributions may skew thereby providing different probability curves (in dashed lines). Particularly, the probability curve of the erased memory cells (differentiated with the reference 205e') may exhibit a tail towards lower currents, and the probability curve of the programmed memory cells (differentiated with the reference 205p') may exhibit a tail towards higher currents. However, when a difference between the direct current and the complementary current of a memory location falls below a reading margin allowing their correct discrimination (for example, 0.5-1.5 μA) a wrong value of the bit stored therein may be read (with a corresponding reading error). When the number of errors in each code word does not exceed the error correction capability of the ECC (i.e., one in the example at issue), the code word may be corrected so as to provide the right data word again; however, this is not possible when the number of errors exceeds the error correction capability of the ECC (i.e., two or more in the example at issue).

In the approach according to an embodiment of the present disclosure, in this case one ore more single-ended versions of the same code word (referred to as singe-ended code words) are read in a single-ended mode, in addition to the above-mentioned standard version thereof read in the differential mode, hereinafter referred to as differential code word. More specifically, a direct version of the code word (referred to as direct code word) is read in a direct mode and/or a complementary version of the code word (referred to as complementary code word) is read in a complementary mode. For this purpose, in the direct mode the direct current provided by the direct memory cell of each memory location is compared with a reference current (for example, 8-12 μA). When the direct current is higher than the reference current, the value 1 is read since the direct memory cell is erased (value 1). Conversely, when the direct current is lower than the reference current, the value 0 is read since the direct memory cell is programmed (value 0). In addition or in alternative, in the complementary mode the complementary current provided by the complementary memory cell of each memory location is compared with a reference current (for example, the same as above). When the complementary current is higher than the reference current, the value 0 is read since the complementary memory cell is erased (complementary value 1); conversely, when the complementary current is lower than the reference current, the value 1 is read since the complementary memory cell is programmed (complementary value 0). When the number of errors in one or more of the single-ended code words does not exceed the error correction capability of the ECC, the single-ended code words may now be used to generate the right data word.

This increases the error correction capability of the memory device for the same amount of control information, so as to improves its reliability, or vice-versa it allows decreasing the amount of control information for the same error correction capability of the memory device, so as to improve its capacity. In both cases, this may also allow simplifying the circuitry used to implement the ECC functionality, with a consequent reduction of waste of area of the memory device (and then increase of its capacity), and decrease of access time of the memory device (thereby fastening its entire operation) and of power consumption thereof.

With reference now to FIGS. 3A-3E, different examples are shown of application of the approach according to an embodiment of the present disclosure.

Each figure shows a same diagram 300 with a portion of the above-mentioned distribution curves 205e' and 205p' (in solid lines and with their skew that is exaggerated for the sake of clarity). A first memory location stores the value 0; its direct memory cell is programmed (value 0) and it provides a direct current denoted with the reference Id1 followed by the suffix of the figure, whereas its complementary memory cell is erased (value 1) and it provides a complementary current denoted with the reference Ic1 followed by the suffix of the figure (both of them indicated by stars on the distribution curves 205p' and 205e', respectively). Moreover, a second memory location stores the value 0 as well; its direct memory cell is programmed (value 0) and it provides a direct current denoted with the reference Id2 followed by the suffix of the figure, whereas its complementary memory cell is erased (value 1) and it provides a complementary current denoted with the reference Ic2 followed by the suffix of the figure (both of them indicated by circles on the distribution curves 205p' and 205e', respectively). The reference Ir instead denotes the reference current that is used to read the same memory locations both in the direct mode and in the complementary mode.

Figure 3A:
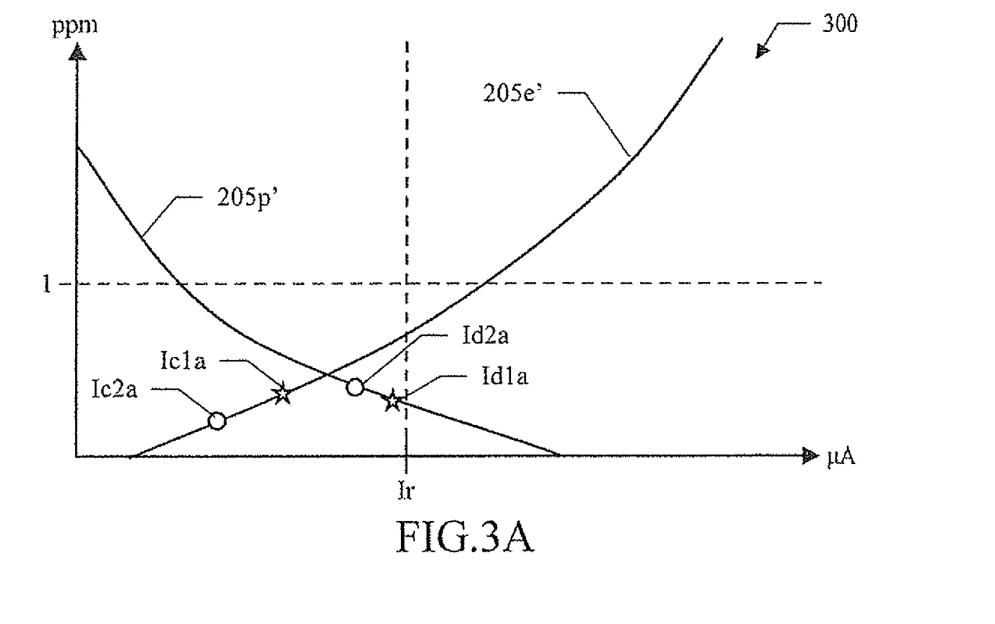
FIGS. 3A-3E are graphs showing different examples of application of the approach according to an embodiment of the present disclosure.

Starting from FIG. 3A, the reading in the differential mode of these memory locations generates two errors. Indeed, in the first memory location the wrong value 1 is read, since its direct current Id1a is higher than its complementary current Ic1a. Likewise, in the second memory location the wrong value 1 is read, since its direct current Id2a is higher than its complementary current Ic2a. Therefore, should the memory locations be comprised in the same differential code word, it would not be possible to correct it.

However, the reading in the direct mode of the same memory locations does not generate any error. Indeed, in the first memory location the right value 0 is read, since the direct current Id1a is lower than the reference current Ir. Likewise, in the second memory location the right value 0 is read, since the reading current Id2a is lower than the reference current Ir. Therefore, assuming that the corresponding direct code word has not other errors, the correct data word may now be generated from it.

Figure 3B:
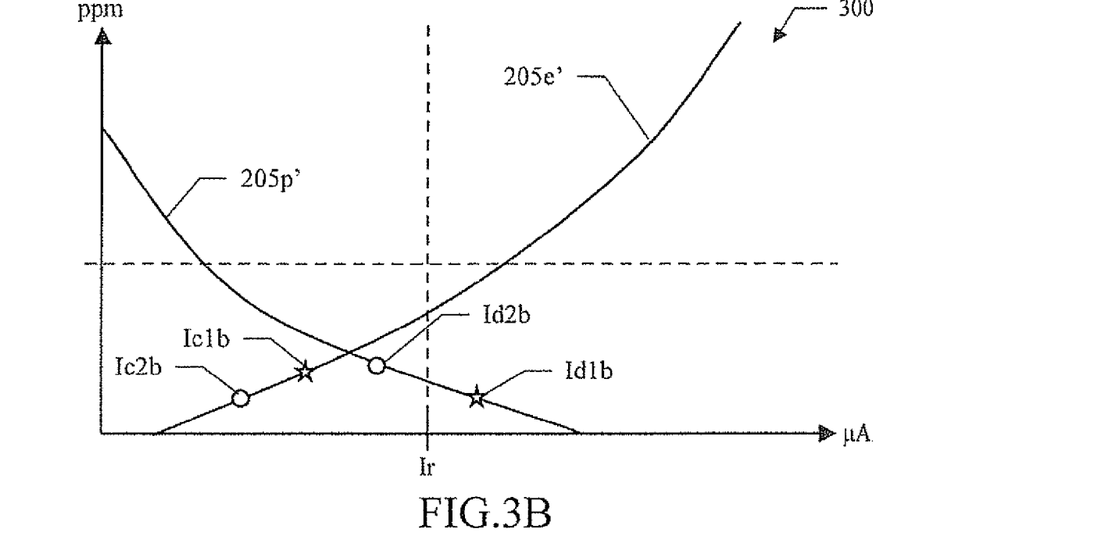

Moving to FIG. 3B, the reading in the differential mode of the memory locations generates two errors as above. However, the reading in the direct mode of the same memory locations generates a single error. Indeed, in the first memory location the wrong value 1 is read, since the direct current Id1b is higher than the reference current Ir. Conversely, in the second memory location the right value 0 is read, since the direct current Id2b is lower than the reference current Ir. Therefore, assuming that the corresponding direct code word has not other errors, the direct code word may be corrected and the correct data word may now be generated from it.

Figure 3C:
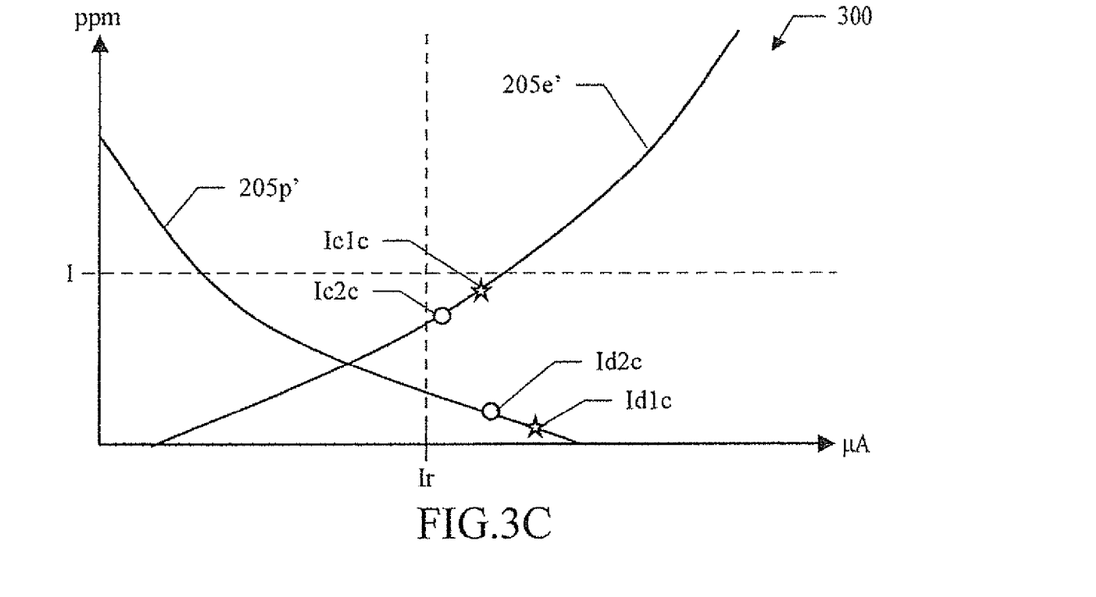

Moving to FIG. 3C, the reading in the differential mode of the memory locations generates two errors as above. The reading in the direct mode of the same memory locations generates two errors as well. Indeed, in the first memory location the wrong value 1 is read, since the direct current Id1c is higher than the reference current Ir; likewise, in the second memory location the wrong value 1 is read, since the direct current Id2c is higher than the reference current Ir. Therefore, it would not be possible to correct the corresponding direct code word either.

However, the reading in the complementary mode of the same memory locations does not generate any error. Indeed, in the first memory location the right value 0 is read, since the complementary current Ic1c is higher than the reference current Ir. Likewise, in the second memory location the right value 0 is read, since the complementary current Ic2c is higher than the reference current Ir. Therefore, assuming that the corresponding complementary code word has not other errors, the correct data word may now be generated from it.

Figure 3D:
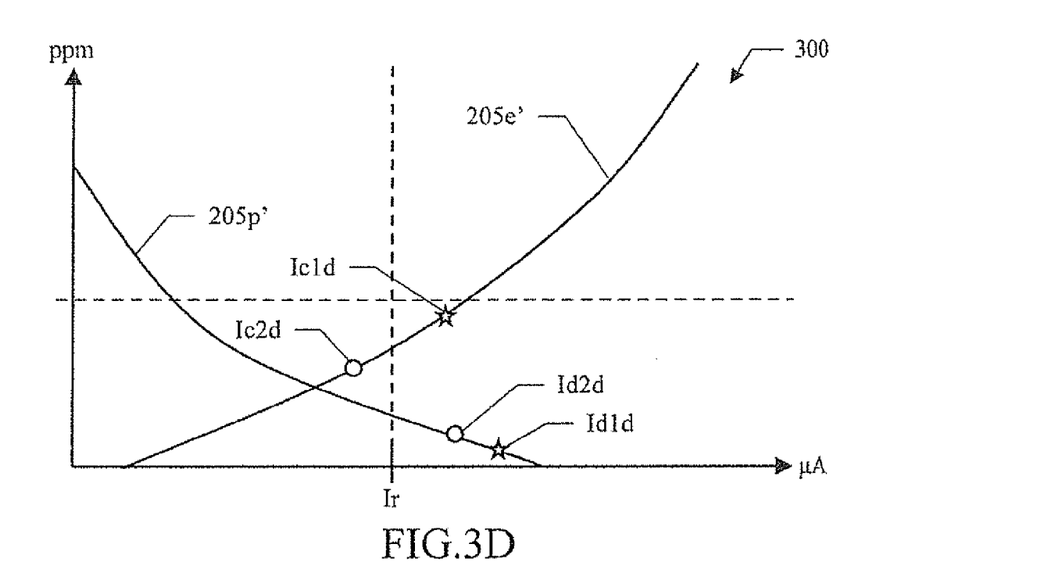

Moving to FIG. 3D, both the reading in the differential mode and the reading in the direct mode of the memory locations generate two errors as above. However, the reading in the complementary mode of the same memory locations generates a single error. Indeed, in the first memory location the right value 0 is read, since the complementary current Ic1d is higher than the reference current Ir. Conversely, in the second memory location the wrong value 1 is read, since the complementary current Ic2d is lower than the reference current Ir. Therefore, assuming that the corresponding complementary code word has not other errors, the complementary code word may be corrected and the correct data word may now be generated from it.

Figure 3E:
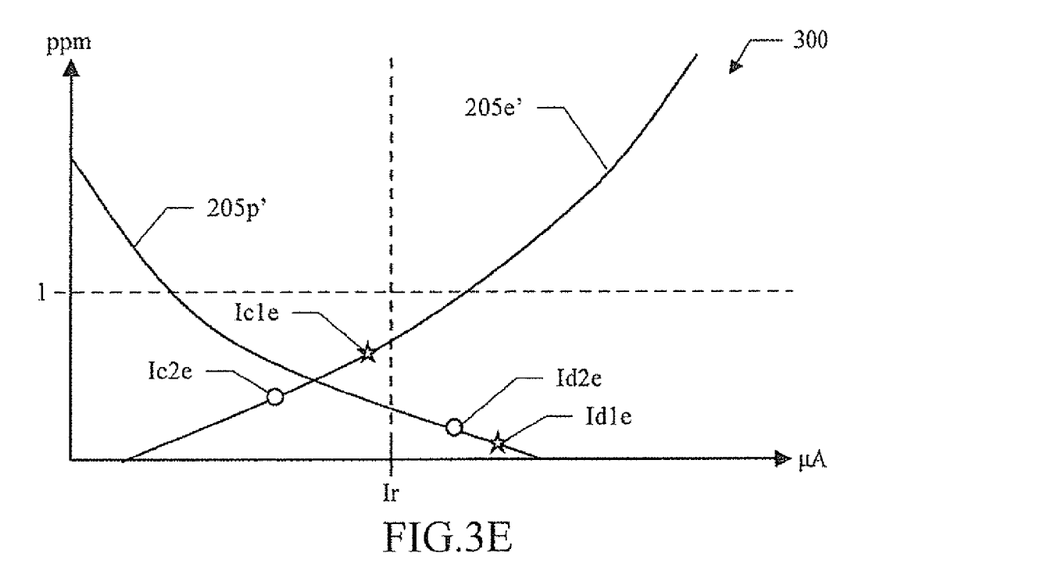

Moving to FIG. 3E, both the reading in the differential mode and the reading in the direct mode of the memory locations generate two errors as above. The reading in the complementary mode of the same memory locations generates two errors as well. Indeed, in the first memory location the wrong value 1 is read, since the complementary current Ic1e is lower than the reference current Ir. Likewise, in the second memory location the wrong value 1 is read, since the complementary current Ic2e is lower than the reference current Ir. Therefore, should the memory cells be comprised in the same complementary code word, it would not be possible to correct it either.

Similar considerations apply to other possible combinations of values of the direct and complementary currents (with respect to each other and/or with respect to the reference current). In this way, it is possible to correct most of the double errors that may occur (since the ones that may not be corrected have a very low probability). Therefore, this provides a quasi-2 error correction capability (with a simple Hamming code of 32+7 bits).

Figure 4A:
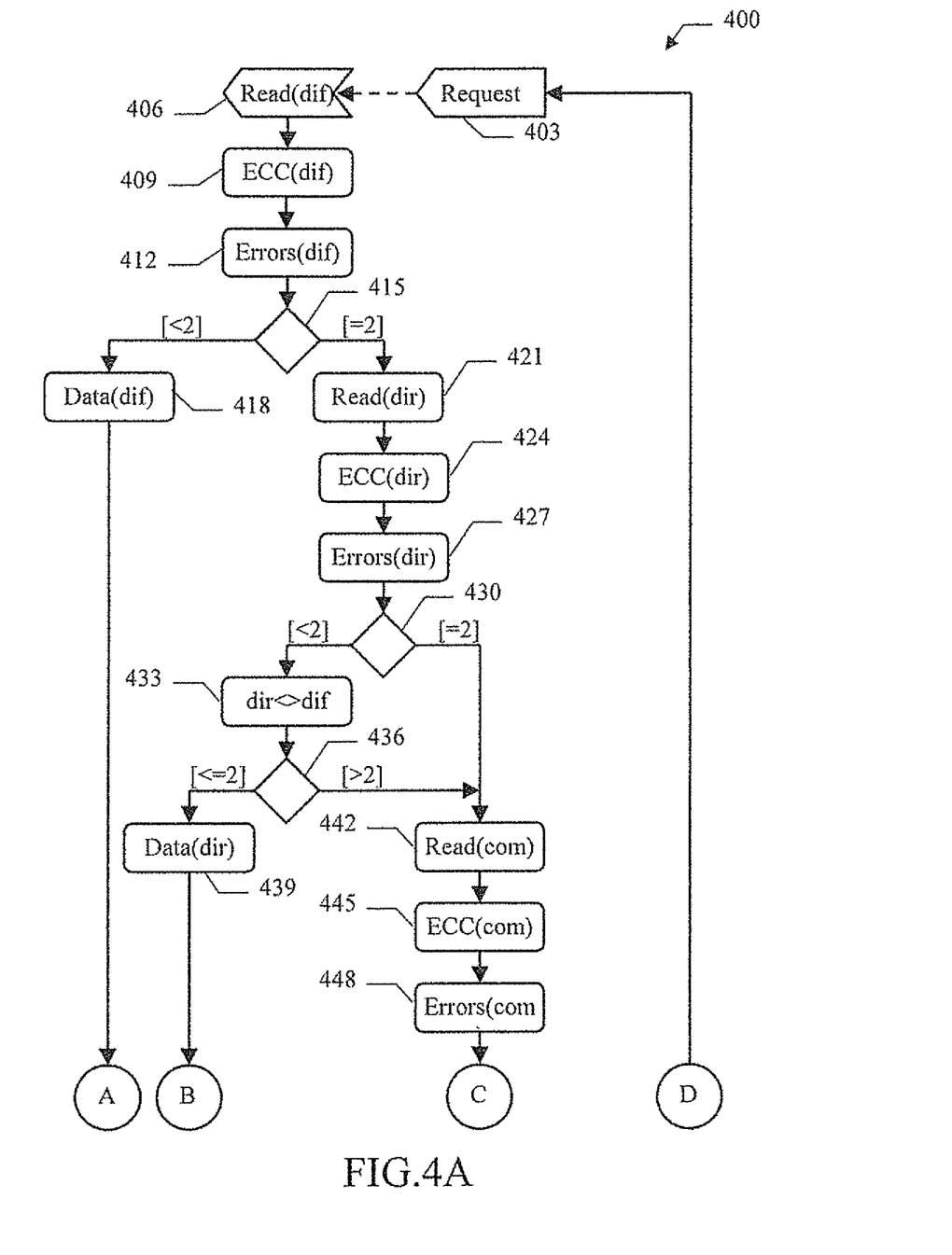
FIGS. 4A-4B is a flowchart showing an activity diagram describing the flow of activities relating to an implementation of the approach according to an embodiment of the present disclosure.
Figure 4B:
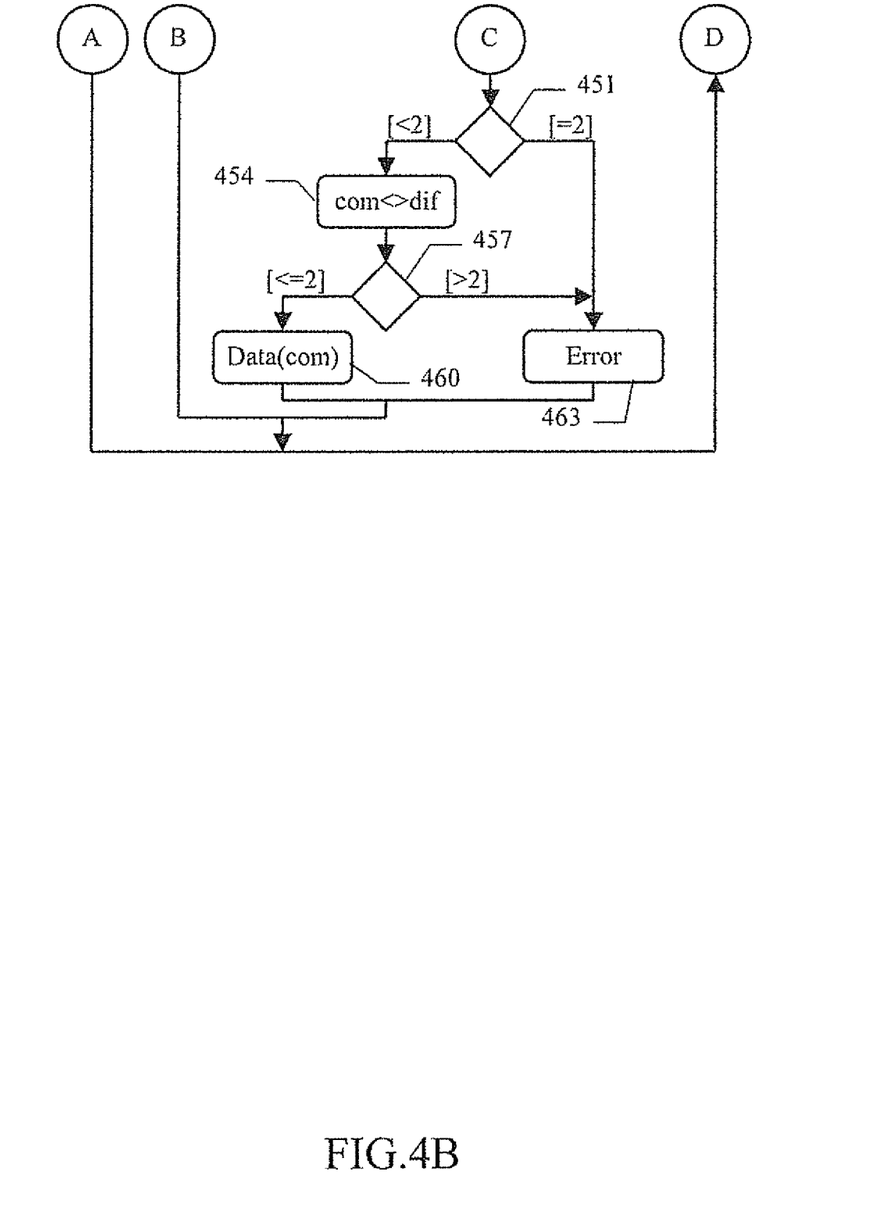

With reference now to FIG. 4, an activity diagram is shown describing the flow of activities relating to an implementation of the solution according to an embodiment of the present disclosure. Particularly, the diagram represents an exemplary process that may be used to read any data word with a method 400. For example, the process may be implemented by a firmware of the control unit of the memory device. In this respect, each block may represent one or more executable instructions for implementing the specified logical function by the control unit.

The process is in a waiting condition at block 403. As soon as a request for reading a selected data word is submitted, the corresponding selected page is read in the differential mode at block 406 so as to provide the corresponding differential code word. The differential code word is then processed at block 409 according to the error correction code. A result of this processing is verified at block 412 (i.e., whether the differential code word is correct, it had a single error that has been detected and corrected, or it has a double error that has only been detected). The flow of activity branches at block 415 according to the number of errors that have been detected (and possibly corrected) in the differential code word. Particularly, if no error has been detected or a single error has been detected and corrected in the differential code word, at block 418 the corresponding data word (referred to as differential data word) is extracted from the differential code word and it is returned as the requested data word.

Conversely, if a double error has been detected but not corrected in the differential code word, the selected page is read in the direct mode at block 421 so as to provide the corresponding direct code word. The direct code word is then processed at block 424 according to the error correction code. A result of this processing is verified at block 427 (i.e., whether the direct code word is correct, it had a single error that has been detected and corrected, or it has a double error that has only been detected). The flow of activity branches at block 430 according to the number of errors that have been detected (and possibly corrected) in the direct code word. Particularly, if no error has been detected or a single error has been detected and corrected in the direct code word, at block 433 the direct code word is compared with the differential code word. The flow of activity further branches at block 436 according to the number of bits that are different between them. Particularly, if at most two different bits are found, at block 439 the corresponding data word (referred to as direct data word) is extracted from the direct code word and it is returned as the requested data word.

Conversely (if three or more different bits are found), the process descends into block 442. The same point is also reached from the block 430 when a double error has been detected but not corrected in the direct code word. In this phase, the selected page is read in the complementary mode so as to provide the corresponding complementary code word. The complementary code word is then processed at block 445 according to the error correction code. A result of this processing is verified at block 448 (i.e., whether the complementary code word is correct, it had a single error that has been detected and corrected, or it has a double error that has only been detected). The flow of activity branches at block 451 according to the number of errors that have been detected (and possibly corrected) in the complementary code word. Particularly, if no error has been detected or a single error has been detected and corrected in the complementary code word, at block 454 the complementary code word is compared with the differential code word. The flow of activity further branches at block 457 according to the number of bits that are different between them. Particularly, if at most two different bits are found, at block 460 the corresponding data word (referred to as complementary data word) is extracted from the complementary code word and it is returned as the requested data word. Conversely, no valid data word is provided and an error condition is entered at block 463; the same point is also reached from the block 451 if a double error has been detected but not corrected in the complementary code word. The process then returns to the block 403 from the block 418, the block 439, the block 460 or the block 463 waiting for a next reading request.

The additional comparison of the direct/complementary code word with the differential code word provides a further decree of accuracy. Indeed, the probability of having errors is higher in the direct/complementary code word (read in the single-ended mode) than it is in the differential code word (read in the differential mode). Therefore, being likely that the differential code word has at most the number of errors that may be detected (i.e., two), when the number of different bits between the direct/complementary code word and the differential code word exceeds the number of errors that may be detected, it may be assumed that the direct/complementary code word has more errors (which have not been detected). In this case, it is safer to discard the direct/complementary code word, so as to avoid the risk of providing a wrong data word.

Figure 5:
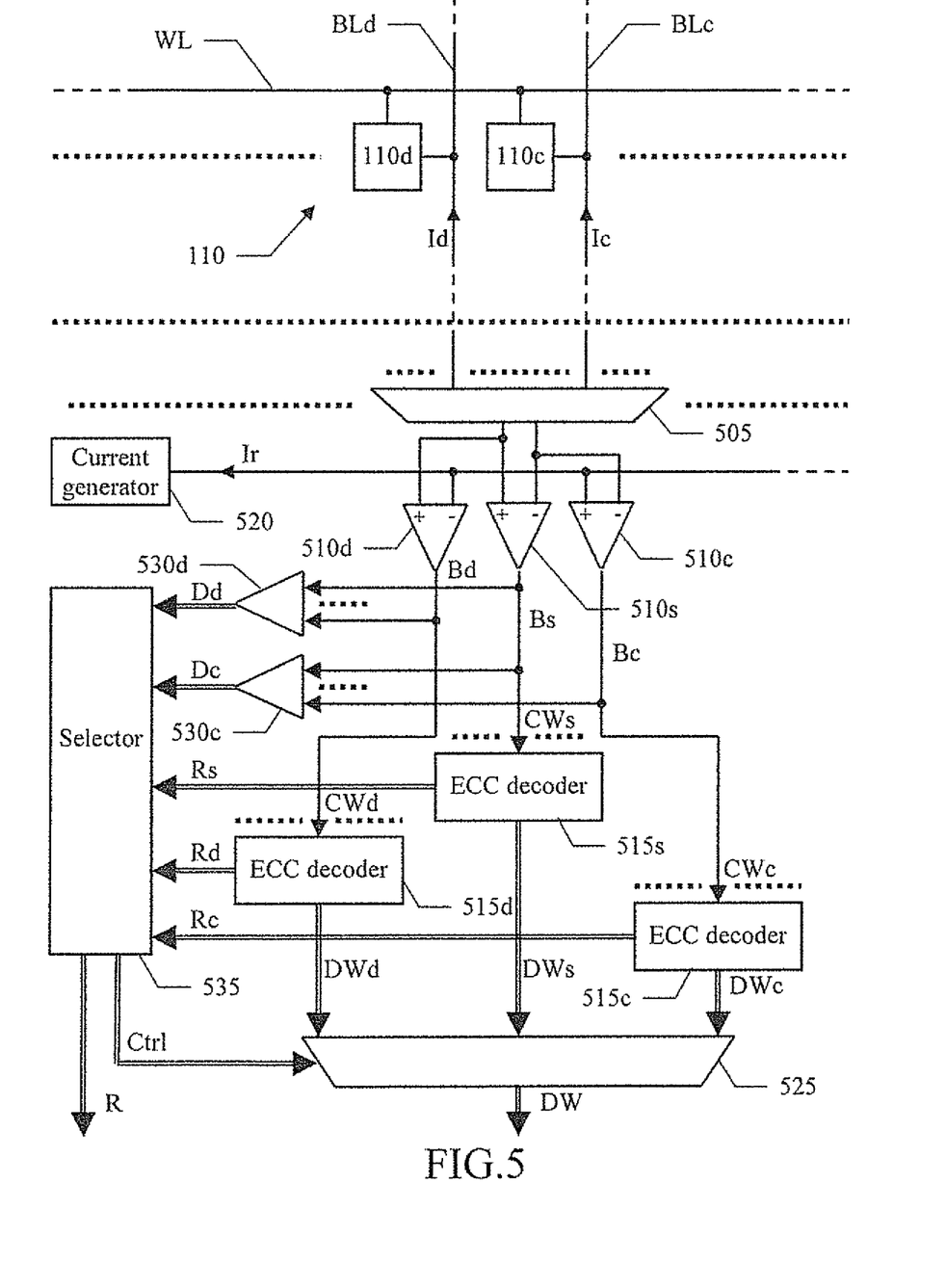
FIG. 5 is a schematic block diagram illustrating a particular memory device according to an embodiment of the present disclosure.

With reference now to FIG. 5, a schematic block diagram is shown of a particular of a memory device according to an embodiment of the present disclosure.

As usual, the memory cells 110d, 110c of each memory location 110 (only one shown in the figure) are coupled (via a drain terminal of their transistors) to a common word line WL of the corresponding row (which is driven by the row decoder, not shown in the figure). Moreover, the direct memory cell 110d and the complementary memory cell 110c are coupled (via a control gate terminal of their transistors) to a common bit line BLd and to a common bit line BLc, respectively, of the corresponding columns.

For each i-th position within all the pages (only one shown in the figure), the column decoder comprises a (column) multiplexer 505 and the read/write unit comprises a (differential) sense amplifier (SA) 510s. The multiplexer 505 selectively couples one among all the corresponding pairs of bit lines BLd, BLc with the sense amplifier 510s. The sense amplifier 510s has a positive input terminal (+) and a negative input terminal (−) for receiving corresponding currents, and an output terminal for providing a bit that has the value 1 when the current at the positive input terminal is higher than the current at the negative input terminal, and the value 0 otherwise. In this case, the sense amplifier 510s has the positive input terminal and the negative input terminal that are coupled with the bit line BLd and the bit line BLc, respectively, selected by the multiplexer 505.

The ECC unit comprises a (differential) ECC decoder 515s (for example, implemented with an EXOR tree). The ECC decoder 515s has input terminals for receiving a code word, and data output terminals for providing the corresponding data word (by correcting it when necessary and possible) and result output terminals for providing a result signal indicative of a result of the decoding of the code word (for example, composed by a signal that is asserted when a single error has been detected and corrected, and another signal that is asserted when a double error has been detected but not corrected). In this case, the ECC decoder 515s has the input terminals coupled with the output terminals of all the sense amplifiers 510s.

In the approach according to an embodiment of the present disclosure, the read/write unit further comprises a reference current generator 520 that provides the reference current Ir. Moreover, for each i-th position within all the pages the column decoder comprises a (direct) sense amplifier 510d and a (complementary) sense amplifier 510c. The sense amplifier 510d has the positive input terminal that is coupled with the bit line BLd selected by the multiplexer 505, and the negative input terminal that is coupled with the reference current generator 520. The sense amplifier 510c instead has the positive input terminal that is coupled with the reference current generator 520 and the negative input terminal that is coupled with the bit line BLc selected by the multiplexer 505.

The ECC unit further comprises a (direct) ECC decoder 515d and a (complementary) ECC decoder 515c. The ECC decoder 515d has the input terminals coupled with the output terminals of all the sense amplifiers 510d, and the ECC decoder 515c has the input terminals coupled with the output terminals of all the sense amplifiers 510c. Moreover, the ECC unit comprises an (ECC) multiplexer 525, which has input terminals coupled with the data output terminals of all the ECC decoders 510s, 510d and 510c, and output terminals that are selectively coupled with one of them at the time. The ECC unit further comprises a comparator 530d (having first input terminals coupled with the data output terminals of all the sense amplifiers 510d and second input terminal coupled with the data output terminals of all the sense amplifiers 510s), and a comparator 530c (having first input terminals coupled with the data output terminals of all the sense amplifiers 510c and second input terminal coupled with the data output terminals of all the sense amplifiers 510s). Moreover, the ECC unit comprises a selector 535, which has comparison input terminals coupled with output terminals of the comparator 530d and with output terminals of the comparator 530c, and result input terminals coupled with the result output terminals of the ECC decoder 510s, with the result output terminals of the ECC decoder 510d and with the result output terminals of the ECC decoder 510c. The selector 530 has control output terminals that are coupled with control terminals of the multiplexer 525, and result output terminals that that are selectively coupled with the result output terminals of one of the ECC decoders 510s, 510d, 510c at the time.

During every reading operation of a selected data word, as usual the memory cells 110d, 110c of the corresponding selected page are biased with a voltage (between their source terminal and control gate terminal) having a value in the middle between the typical threshold voltage of the erased memory cells and of the programs memory cells, so as to conduct a current corresponding to their actual threshold voltage (i.e., normally high when erased and low when programmed); all the other memory cells are instead biased so as to be always off. As a result, the bit lines BLd of the direct memory cells 110d and the bit lines BLc of the complementary memory cells 110c of the selected page conduct the direct currents (denoted with Id) and the complementary currents (denoted with Ic), respectively, provided by them. Each sense amplifier 510s receives the corresponding pair of currents Id, Ic (through the multiplexer 505), and it outputs the corresponding i-th bit of the differential code word (denoted with bs), which has the value 1 when the direct current Id is higher than the complementary current Ic, or the value 0 otherwise. The bits bs provided by all the sense amplifiers 510s define the differential code word (denoted with CWs), which is provided to the ECC decoder 510s; the ECC decoder 510s accordingly generates the differential data word and the corresponding (differential) result signal (denoted with DWs and Rs, respectively).

In the approach according to an embodiment of the present disclosure, at the same time each sense amplifier 510d receives the corresponding direct current Id (through the multiplexer 505) and the reference current Ir, and it then outputs the corresponding i-th bit of the direct code word (denoted with bd), which has the value 1 when the direct current Id is higher than the reference current Ir, or the value 0 otherwise. The bits bd provided by all the sense amplifiers 510d define the direct code word (denoted with CWd), which is provided to the ECC decoder 510d. The ECC decoder 510d accordingly generates the direct data word and the corresponding (direct) result signal (denoted with DWd and Rd, respectively). The comparator 530d receives the direct code word CWd (from the sense amplifiers 510d) and the differential code word CWs (from the sense amplifiers 510s), and it outputs a comparison signal Dd that counts the number of different bits between the code words CWd and CWs.

Moreover, at the same time each sense amplifier 510c receives the corresponding complementary current Ic (through the multiplexer 505) and the reference current Ir, and it then outputs the corresponding i-th bit of the complementary code word (denoted with bc), which has the value 0 when the complementary current Ic is higher than the reference current Ir, or the value 1 otherwise. The bits bc provided by all the sense amplifiers 510c define the complementary code word (denoted with CWc), which is provided to the ECC decoder 510c. The ECC decoder 510c accordingly generates the complementary data word and the corresponding (complementary) result signal (denoted with DWc and Rc, respectively). The comparator 530c receives the complementary code word CWc (from the sense amplifiers 510c) and the differential code word CWs (from the sense amplifiers 510s), and it outputs a comparison signal Dc that counts the number of different bits between the code words CWc and CWs.

The selector 535 receives the comparison signal Dd (from the comparator 530d), the comparison signal Dc (from the comparator 530c), the result signal Rs (from the ECC decoder 515s), the result signal Rd (from the ECC decoder 515d) and the result signal Rc (from the ECC decoder 515c). Accordingly, the selector 535 outputs a control signal Ctr that controls the multiplexer 525 to output one among the differential data word DWs, the direct data word DWd and the complementary data word DWc for the desired data word defining the result of the reading operation (denoted with DW). At the same time, the selector 35 outputs the corresponding one of the result signals Rs, Rd and Rc defining the result signal of the data word DW (denoted with R).

In the above-described implementation, all the operations relating to the readings in the differential mode, in the direct mode and in the complementary mode and the corresponding processing according to the error correction code are performed concurrently. As a result, the access time of the memory device (and then its entire operation) is not adversely affected. Particularly, all the operations may be performed in a single clock period of the memory device, so as to be completely opaque to its control unit.

Naturally, to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof. Conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), the term a/an should be intended as one or more items (unless expressly indicated otherwise.

For example, an embodiment provides a method for reading a differential memory device, which comprises a plurality of memory locations each one comprising a direct memory cell and a complementary memory cell. The method comprises the following steps. A request is received of reading a selected data word associated with a selected code word, which comprises a plurality of logic values stored in one or more selected memory locations with an error correction code. A differential code word (representing a differential version of the selected code word) is read by comparing a state of the direct memory cell with a state of the complementary memory cell of each selected memory location. The differential code word is verified according to the error correction code. The selected data word is set according to the differential code word in response to a positive verification of the differential code word. At least one single-ended code word (representing a single-ended version of the selected code word) is read by comparing the state of the direct memory cell of each selected memory location with a direct reference and/or by comparing the state of the complementary memory cell of each selected memory location with a complementary reference. The single-ended code word is verified according to the corresponding error correction code. The selected data word is set according to the single-ended code word in response to a negative verification of the differential code word and to a positive verification of the single-ended code word.

However, the method may be applied to any memory device (see below). The code/data words may comprise any type and number of logic values (even not in binary logic), which are stored in any number of memory locations (either the same or different from the number of logic values of the code word). Any error correction code may be used; for example, it is possible to use data/code words of any lengths, any number of one or more control bits, and any coding scheme (for example, BCH). The code words may be read in any way (for example, with any margin in the differential mode and with any references in the direct mode and in the complementary mode, even different to each other). The code words may be verified in any way (for example, according to polynomial algorithms). The selected data word may be set in any way according to the corresponding code word (for example, by simply extracting its logic values from corresponding positions of the code word, possibly corrected, or by calculating it from the code word with a specific algorithm).

In an embodiment, verifying the single-ended code word and verifying the single-ended code word comprise verifying a correctness of or a possibility of correcting the corresponding code word according to the error correction code. Setting the selected data word according to the differential code word and said setting the selected data word according to the single-ended code word comprise the following steps. The selected code word is set according to the corresponding code word in response to a positive verification of the correctness of the corresponding code word. Alternatively, the corresponding code word is corrected according to the error correction code and the selected code word is set according to the corrected corresponding code word in response to a negative verification of the correctness of the corresponding code word and to a positive verification of the possibility of correcting the corresponding code word.

However, any number of errors may be detected and corrected. Moreover, the code words may be corrected in any way. For example, it is possible to re-write the selected memory locations as well (for example, by saving the content of a corresponding sector into a buffer, erasing it, and then re-writing it with the correct values). In any case, the possibility of only correcting or even only detecting the errors is not excluded (for example, with any code word that it used directly only when it is correct).

In an embodiment, reading at least one single-ended code word comprises reading a direct code word representing a direct version of the selected code word by comparing the state of the direct memory cell of each selected memory location with the direct reference, and reading a complementary code word representing a complementary version of the selected code word by comparing the state of the complementary memory cell of each selected memory location with the complementary reference. Setting the selected data word according to the single-ended code word comprises setting the selected data word according to the direct code word in response to a negative verification of the differential code word and to a positive verification of the direct code word, and setting the selected data word according to the complementary code word in response to a negative verification of the differential code word and of the direct code word and to a positive verification of the complementary code word.

However, nothing prevents setting the selected data word according to the complementary code word in response to a negative verification of the differential code word and to a positive verification of the complementary code word, and setting the selected data word according to the direct code word in response to a negative verification of the differential code word and of the complementary code word and to a positive verification of the direct code word. Moreover, when the verification of both the direct code word and the complementary code word are negative, it is also possible to try inferring the selected data word by comparing all the available code words (for example, with a majority scheme). In any case, a simplified implementation based on the reading in the direct mode only or in the complementary mode only is not excluded.

In an embodiment, setting the selected data word according to the single-ended code word comprises comparing the single-ended code word with the differential code word, and enabling the setting of the selected data word according to the single-ended code word, according to a result of the comparison.

However, the comparison of the code words may be performed in any way; for example, it is possible to compare the whole code words or only a part thereof (such as the corresponding data words). Moreover, the enabling of the setting of the selected data word may be based on any criteria (see below). In any case, this additional feature may be omitted in a simplified implementation.

In an embodiment, enabling the setting comprises enabling the setting of the selected data word when a number of the logic values being different between the single-ended code word and the differential code word does not exceed a maximum number of wrong logic values of the selected code word that may be detected according to the error correction code. However, the enabling of the setting may be based on a cross-comparison between all the code words and the corresponding number of different logic values.

Generally, similar considerations apply if the same approach is implemented with an equivalent method (by using similar steps with the same functions of more steps or portions thereof, removing some steps being non-essential, or adding further optional steps); moreover, the steps may be performed in a different order, concurrently or in an interleaved way (at least in part).

A further embodiment provides a software program adapted to implement this method. However, similar considerations apply if the software program takes any other form suitable to be used by any computing machine on in connection therewith, thereby configuring the computing machine to perform the desired operations; particularly, the program may be in the form of resident software, firmware, or microcode, which may be provided on any medium suitable to contain, store, communicate, propagate, or transfer it (and particularly as an article of manufacture on a non-transitory medium). In any case, the same approach lends itself to be implemented with a hardware structure (for example, integrated in a chip of semiconductor material), or with a combination of software and hardware suitably programmed or otherwise configured.

A further embodiment provides a differential memory device, which comprises a plurality of memory locations each one comprising a direct memory cell and a complementary memory cell. The memory device comprises circuitry or means for receiving a request of reading a selected data word associated with a selected code word, which comprises a plurality of logic values stored in one or more selected memory locations with an error correction code. The memory device comprises circuitry or means for reading a differential code word (representing a differential version of the selected code word) by comparing a state of the direct memory cell with a state of the complementary memory cell of each selected memory location. The memory device comprises circuitry or means for verifying the differential code word according to the error correction code. The memory device comprises circuitry or means for setting the selected data word according to the differential code word in response to a positive verification of the differential code word. The memory device comprises circuitry or means for reading at least one single-ended code word (representing a single-ended version of the selected code word) by comparing the state of the direct memory cell of each selected memory location with a direct reference and/or by comparing the state of the complementary memory cell of each selected memory location with a complementary reference. The memory device comprises circuitry or means for verifying the single-ended code word according to the error correction code. The memory device comprises circuitry or means for setting the selected data word according to the single-ended code word in response to a negative verification of the differential code word and to a positive verification of the single-ended code word.

However, the memory device may be of any non-volatile or even volatile type (for example, flash, EPROM, PCM, SRAM, DRAM), and with any number and type of memory cells (for example, of multilevel type). The means for receiving the reading request may be implemented in any way (for example, with one or more input terminals for receiving the relevant information either is series or in parallel, with or without any corresponding buffer). The means or circuitry for reading the differential code word and each single-ended code word may be implemented in any way. For example, it is possible to compare any quantities (such as currents, voltages) representing a state of the memory cells, either in series or in parallel (for example, with a single sense amplifier or with two or more sense amplifiers for each bit). The means or circuitry for verifying the differential code word and each single-ended code word may be implemented in any way, for example, with a combinatorial network or a firmware of the control unit, either in series or in parallel (for example, with a single ECC decoder or two or more ECC decoders for each bit). The means or circuitry for setting the selected data word may be implemented in any way (for example, with a combinatorial network or a firmware of the control unit).

In an embodiment, the means or circuitry for verifying the differential code word and the means or circuitry for verifying the single-ended code word comprise circuitry or means for verifying a correctness of or a possibility of correcting the corresponding code word according to the error correction code. The means or circuitry for setting the selected data word according to the differential code word and the means for setting the selected data word according to the single-ended code word comprise circuitry or means for setting the selected code word according to the corresponding code word in response to a positive verification of the correctness of the corresponding code word, and circuitry or means for correcting the corresponding code word according to the error correction code and means for setting the selected code word according to the corrected corresponding code word in response to a negative verification of the correctness of the corresponding code word and to a positive verification of the possibility of correcting the corresponding code word.

However, both the means or circuitry for verifying and the means or circuitry for setting may be implemented in any way (see above), either in series or in parallel for the verification and the correction of each code word.

In an embodiment, the means or circuitry for reading at least one single-ended code word comprises circuitry or means for reading a direct code word representing a direct version of the selected code word by comparing the state of the direct memory cell of each selected memory location with the direct reference, and circuitry or means for reading a complementary code word representing a complementary version of the selected code word by comparing the state of the complementary memory cell of each selected memory location with the complementary reference. The means or circuitry for setting the selected data word according to the single-ended code word comprises circuitry or means for setting the selected data word according to the direct code word in response to a negative verification of the differential code word and to a positive verification of the direct code word, and circuitry or means for setting the selected data word according to the complementary code word in response to a negative verification of the differential code word and of the direct code word and to a positive verification of the complementary code word.

However, the means or circuitry for reading and the means or circuitry for setting may be implemented in any way (see above), either in series or in parallel for the direct mode and the complementary mode.

In an embodiment, the means or circuitry for setting the selected data word according to the single-ended code word comprises circuitry or means for comparing the single-ended code word with the differential code word, and circuitry or means for enabling the setting of the selected data word according to the single-ended code word according to a result of the comparison.

However, the means or circuitry for comparing and the means for enabling may be implemented in any way (for example, with a combinatorial network or a firmware of the control unit), either in series or in parallel.

In an embodiment, the means or circuitry for enabling the setting comprises circuitry or means for enabling the setting of the selected data word when a number of the logic values being different between the single-ended code word and the differential code word does not exceed a maximum number of wrong logic values of the selected code word that may be detected according to the error correction code. However, the means or circuitry for enabling may be implemented in any way (see above), either in series or in parallel for the direct mode and the complementary mode.

A further embodiment provides a system comprising one or more of these complementary memory devices. However, the system may be of any type (for example, a smart-card, a smart-phone, an automotive system).

Generally, similar considerations apply if the memory device and the system each has a different structure or comprises equivalent components, or it has other operative characteristics. In any case, every component thereof may be separated into more elements, or two or more components may be combined together into a single element. Moreover, each component may be replicated to support the execution of the corresponding operations in parallel. Moreover, unless specified otherwise, any interaction between different components generally does not need to be continuous, and it may be either direct or indirect through one or more intermediaries.

That which is claimed:

1. A method for reading a differential memory device comprising a plurality of memory locations each comprising a direct memory cell and a complementary memory cell, the method comprising:
    receiving a request of reading a selected data word associated with a selected code word comprising a plurality of logic values stored in at least one selected memory location with an error correction code;
    reading a differential code word representing a differential version of the selected code word by comparing a state of the direct memory cell with a state of the complementary memory cell of each selected memory location;
    verifying the differential code word according to the error correction code;
    setting the selected data word according to the differential code word in response to a positive verification of the differential code word;
    reading at least one single-ended code word representing a single-ended version of the selected code word by at least one of comparing the state of the direct memory cell of each selected memory location with a direct reference and comparing the state of the complementary memory cell of each selected memory location with a complementary reference;
    verifying the single-ended code word according to the error correction code; and
    setting the selected data word according to the single-ended code word in response to a negative verification of the differential code word and to a positive verification of the single-ended code word.

2. The method according to claim 1, wherein verifying the single-ended code word and verifying the differential code word comprise at least one of verifying a correctness of the corresponding code word and verifying an option of correcting the corresponding code word according to the error correction code; and wherein setting the selected data word according to the differential code word and setting the selected data word according to the single-ended code word comprise:
    setting the selected code word according to the corresponding code word in response to a positive verification of the correctness of the corresponding code word; and
    correcting the corresponding code word according to the error correction code and setting the selected code word according to the corrected corresponding code word in response to a negative verification of the correctness of the corresponding code word and to a positive verification of the option of correcting the corresponding code word.

3. The method according to claim 1, wherein reading at least one single-ended code word comprises reading a direct code word representing a direct version of the selected code word by comparing the state of the direct memory cell of each selected memory location with the direct reference, and reading a complementary code word representing a complementary version of the selected code word by comparing the state of the complementary memory cell of each selected memory location with the complementary reference; and wherein setting the selected data word according to the single-ended code word comprises:

setting the selected data word according to the direct code word in response to a negative verification of the differential code word and to a positive verification of the direct code word; and setting the selected data word according to the complementary code word in response to a negative verification of the differential code word and of the direct code word and to a positive verification of the complementary code word.

4. The method according to claim 1, wherein setting the selected data word according to the single-ended code word comprises:

comparing the single-ended code word with the differential code word; and enabling the setting of the selected data word according to the single-ended code word according to a result of the comparison.

5. The method according to claim 4, wherein enabling the setting comprises enabling the setting of the selected data word when a number of the logic values being different between the single-ended code word and the differential code word does not exceed a maximum number of wrong logic values of the selected code word that can be detected according to the error correction code.

6. A method for reading a differential memory device comprising a plurality of memory locations each comprising a direct memory cell and a complementary memory cell, the method comprising:

receiving a request of reading a selected data word associated with a selected code word stored in selected memory locations with an error correction code;

reading a differential code word representing a differential version of the selected code word based upon a state of the direct memory cell and a state of the complementary memory cell of selected memory locations;

verifying the differential code word according to the error correction code;

setting the selected data word according to the differential code word in response to a positive verification of the differential code word;

reading at least one single-ended code word representing a single-ended version of the selected code word based upon at least one of the state of the direct memory cell of selected memory locations, a direct reference, the state of the complementary memory cell of selected memory locations, and a complementary reference;

verifying the single-ended code word according to the error correction code; and setting the selected data word according to the single-ended code word in response to a negative verification of the differential code word and to a positive verification of the single-ended code word.

7. The method according to claim 6, wherein verifying the single-ended code word and verifying the differential code word comprise at least one of verifying a correctness of the corresponding code word and verifying an option of correcting the corresponding code word according to the error correction code; and wherein setting the selected data word according to the differential code word and setting the selected data word according to the single-ended code word comprise:

setting the selected code word according to the corresponding code word in response to a positive verification of the correctness of the corresponding code word; and correcting the corresponding code word according to the error correction code and setting the selected code word according to the corrected corresponding code word in response to a negative verification of the correctness of the corresponding code word and to a positive verification of the option of correcting the corresponding code word.

8. The method according to claim 6, wherein reading at least one single-ended code word comprises reading a direct code word representing a direct version of the selected code word by comparing the state of the direct memory cell of each selected memory location with the direct reference, and reading a complementary code word representing a complementary version of the selected code word by comparing the state of the complementary memory cell of each selected memory location with the complementary reference; and wherein setting the selected data word according to the single-ended code word comprises:

setting the selected data word according to the direct code word in response to a negative verification of the differential code word and to a positive verification of the direct code word; and setting the selected data word according to the complementary code word in response to a negative verification of the differential code word and of the direct code word and to a positive verification of the complementary code word.

9. The method according to claim 6, wherein setting the selected data word according to the single-ended code word comprises:

comparing the single-ended code word with the differential code word; and enabling the setting of the selected data word according to the single-ended code word according to a result of the comparison.

10. The method according to claim 9, wherein enabling the setting comprises enabling the setting of the selected data word when a number of logic values that are different between the single-ended code word and the differential code word does not exceed a maximum number of wrong logic values of the selected code word that can be detected according to the error correction code.

11. A differential memory device comprising:

a plurality of memory locations each one comprising a direct memory cell and a complementary memory cell;

circuitry to receive a request of reading a selected data word associated with a selected code word comprising a plurality of logic values stored in at least one selected memory location of the plurality of memory locations with an error correction code;

circuitry to reading a differential code word representing a differential version of the selected code word by comparing a state of the direct memory cell with a state of the complementary memory cell of each selected memory location;

circuitry to verify the differential code word according to the error correction code;

circuitry to set the selected data word according to the differential code word in response to a positive verification of the differential code word;

circuitry to read at least one single-ended code word representing a single-ended version of the selected code word by at least one of comparing the state of the direct memory cell of each selected memory location with a direct reference and comparing the state of the complementary memory cell of each selected memory location with a complementary reference;

circuitry to verify the single-ended code word according to the error correction code; and circuitry to set the selected data word according to the single-ended code word in response to a negative verification of the differential code word and to a positive verification of the single-ended code word.

12. The memory device according to claim 11, wherein the circuitry to verify the differential code word and the circuitry to verify the single-ended code word comprise circuitry to verify at least one of a correctness of the corresponding code word and an option of correcting the corresponding code word according to the error correction code; and wherein the circuitry to set the selected data word according to the differential code word and the circuitry to set the selected data word according to the single-ended code word comprise:

circuitry to set the selected code word according to the corresponding code word in response to a positive verification of the correctness of the corresponding code word; and circuitry to correct the corresponding code word according to the error correction code and circuitry to set the selected code word according to the corrected corresponding code word in response to a negative verification of the correctness of the corresponding code word and to a positive verification of the possibility of correcting the corresponding code word.

13. The memory device according to claim 11, wherein the circuitry to read at least one single-ended code word comprises circuitry to read a direct code word representing a direct version of the selected code word by comparing the state of the direct memory cell of each selected memory location with the direct reference, and circuitry to read a complementary code word representing a complementary version of the selected code word by comparing the state of the complementary memory cell of each selected memory location with the complementary reference; and wherein the circuitry to set the selected data word according to the single-ended code word comprises:

circuitry to set the selected data word according to the direct code word in response to a negative verification of the differential code word and to a positive verification of the direct code word; and circuitry to set the selected data word according to the complementary code word in response to a negative verification of the differential code word and of the direct code word and to a positive verification of the complementary code word.

14. The memory device according to claim 11, wherein the circuitry to set the selected data word according to the single-ended code word comprises circuitry to compare the single-ended code word with the differential code word, and circuitry to enable the setting of the selected data word according to the single-ended code word according to a result of the comparison.

15. The memory device according to claim 14, wherein the circuitry to enable the setting comprises circuitry to enable the setting of the selected data word when a number of the logic values being different between the single-ended code word and the differential code word does not exceed a maximum number of wrong logic values of the selected code word that can be detected according to the error correction code.

* * * * *